United States Patent [19]

Kashiba et al.

[11] Patent Number: 5,251,803
[45] Date of Patent: Oct. 12, 1993

[54] CERAMIC-METAL COMPOSITE SUBSTRATE AND METHOD FOR PRODUCING THE SAME

[75] Inventors: Yoshihiro Kashiba; Masaru Okada, both of Amagasaki, Japan

[73] Assignee: Mitsubishi Denki Kabushiki Kaisha, Tokyo, Japan

[21] Appl. No.: 789,074

[22] Filed: Nov. 7, 1991

Related U.S. Application Data

[63] Continuation of Ser. No. 675,063, Mar. 26, 1991, Pat. No. 5,153,077, which is a continuation of Ser. No. 381,964, Jul. 19, 1989, abandoned.

[30] Foreign Application Priority Data

Jul. 22, 1988 [JP] Japan .................................. 63-184033
Dec. 28, 1988 [JP] Japan .................................. 63-332253
Jul. 17, 1989 [JP] Japan .................................. 1-185235

[51] Int. Cl.$^5$ .............................................. B23K 20/02
[52] U.S. Cl. .................................. 228/124.5; 228/194
[58] Field of Search ............ 228/122, 124, 194, 263.12

[56] References Cited

U.S. PATENT DOCUMENTS

| | | | |
|---|---|---|---|
| 3,795,041 | 3/1974 | Hennicke et al. | 228/194 X |
| 3,915,369 | 10/1975 | Schmidt-Bruecken | 228/194 |
| 3,994,430 | 11/1976 | Cusano et al. | 228/122 |
| 4,735,866 | 4/1988 | Moorhead | 228/122 X |
| 4,901,904 | 2/1990 | Tsuno | 228/122 |

FOREIGN PATENT DOCUMENTS 3421922 12/1984 Fed. Rep. of Germany .
3422329 1/1985 Fed. Rep. of Germany .

OTHER PUBLICATIONS

German journal Metall, 41st year, vol. 11, pp. 1108–1115.
German journal Metalloberfräche, 40 (1986) 8, p. 348.

*Primary Examiner*—Kenneth J. Ramsey
*Attorney, Agent, or Firm*—Oblon, Spivak, McClelland, Maier & Neustadt

[57] ABSTRACT

A method for producing a ceramic-metal composite substrate, which comprises integrally bonding together a ceramic base member, metal members of a material selected from the group consisting of copper and alloys thereof, and a constraining member to be bonded to the metal member, wherein improvement comprises: bringing the metal member into close contact with ceramic base member through a thin film layer having a thickness of from 0.1 μm to 3 μm and containing therein an active metal; and heating the combination of the ceramic base member, the metal member, and the constraining member in an atmosphere which is difficult to react with the active metal, to a temperature ranging from a melting point of an alloy to be formed of the metal member and the active metal to a temperature below the melting point of the metal member, while applying a pressing force to combination in the direction of its thickness, thereby realizing the integral bonding.

12 Claims, 10 Drawing Sheets

CERAMIC-METAL COMPOSITE SUBSTRATE AND METHOD FOR PRODUCING THE SAME

This is a continuation of application Ser. No. 07/675,063, filed on Mar. 26, 1991, now U.S. Pat. No. 5,153,077, which is a continuation of Ser. No. 07/381,964 filed Jul. 19, 1989 now abandoned.

BACKGROUND OF THE INVENTION

1. Field of the Invention

This invention relates to a ceramic-metal composite substrate manufactured by bonding a ceramic base material and a metal material, and on which a semiconductor element, for example, is to be mounted. More particularly, it is concerned with a structure of such substrate capable of preventing the semiconductor element and the ceramic base member from breaking. This invention is also concerned with a method for producing the ceramic-metal composite substrate.

2. Discussion of Background

FIG. 5 of the accompanying drawing is a cross-sectional view illustrating a composite substrate for mounting thereon a semiconductor element, as disclosed in, for example, Japanese Unexamined Patent Publication No. 155580/1985, in which a conventional ceramic base and metal members are directly bonded. In the drawing, a reference numeral 1 dsignates an alumina member as the ceramic base; reference numerals 2A, 2B denote the metal members formed on the ceramic base member, such as, for example, tough pitch electrolytic copper plate to form an electric circuit; and numerals 7A, 7B refer to bonding surfaces, at which the alumina base 1 and the respective copper plates 2A, 2B are directly bonded.

FIG. 6 of the accompanying drawing is a perspective view showing one embodiment of using a conventional substrate for mounting thereon a semiconductor element, the substrate being of a modular structure, on which a semiconductor element is mounted. In the drawing, a reference numeral 4 designates a semiconductor, a numeral 5 refers to solder for mounting the semiconductor element 4 onto a copper plate 2b, and reference numerals 6a, 6b denote bonding wires of, for example, aluminum for driving the semiconductor element 4, the bonding wires being connected to other copper plates 2a, 2b (external connecting electrodes) in a manner to be electrically insulated from the copper plate 2b.

When the modular semiconductor element, particularly a high-power semiconductor element of the above-described construction is actuated, the semiconductor element 4 generates a large amount of heat. As a matter of course, this modulus semiconductor element is used repeatedly, hence the substrate for mounting the semiconductor element is required to have its properties as follows: (i) it can sufficiently dissipate heat to be generated from the semiconductor 4; (ii) it does not give damage to the semiconductor element 4 due to expansion and contraction of the substrate caused by the heat-cycle to be accompanied by actuation and inactuation of the semiconductor element; and (iii) further, the alumina base member itself is not damaged by this heat-cycle.

With the substrate structure as mentioned above, however, the ceramic base 1 generally possesses a low thermal expansion coefficient, which is $7 \times 10^{-6}$ for the alumina ceramic in the above-described embodiment. On account of this, when it is brought into direct contact with the copper plates 2A, 2B having the thermal expansion coefficient of $17 \times 10^{-6}$, stress occurred in the vicinity of the bonding surfaces 7A, 7B owing to difference in the thermal expansion coefficient between the ceramic base member and the copper plates. When such bonded members are subjected to the heat-cycle, there takes place a point of problem such that a large stress repeatedly occurs in the vicinity of the above-mentioned bonding surfaces 7A, 7B, whereby the hard but brittle alumina base member 1 can no logner withstand such large stress, brings about cracks, and becomes-finally broken.

FIG. 7 of the accompanying drawing is a cross-sectional view showing typical cracks 8A, 8B, 8C and 8D to occur in the alumina base member 1, wherein the cracks start from the corner parts of the ceramic base member 1 and the copper plates 2A, 2B where the stress is concentrated. In addition, since the copper plates 2A, 2B are rigidly bonded to the alumina base member 1, the thermal expansion coefficient thereof is smaller than that of simple copper. Nevertheless, when the silicon semiconductor element 4 having its thermal expansion coefficient of as small as $5 \times 10^{-6}$ is mounted on this alumina base member 1 by means of soldering, there still remains a problem such that cracks also occur in the semiconductor element 4 itself. These points of problem emerged conspicuously when the copper plates 2A, 2B were made thicker for increasing the operating current in the semiconductor element 4, and when a semiconductor element having a large area was mounted on the base member.

While it is possible to attain improvement to some extent with regard to the above-mentioned occurrence of the cracks by increasing the thickness of the alumina base member 1, the heat-dissipating property of the semiconductor 4 becomes deteriorated due to high heat-resistance of the alumina base member 1. For example, by increasing the thickness of the alumina base member 1 from its original gauge of 0.4 mm to 0.63 mm, its heat-cycle resistant property in a range of from $-40°$ C. to $150°$ C. can be increased by about 1.2 times; on the contrary, however, the heat-resistance value of the alumina base member, which hinders heat-dissipation, increases by about 1.6 times. As the consequence, this increase in the thickness of the base plate cannot be so effective a method, when taking the function of the semiconductor element 4, the production cost of the ceramic base member 1, and so forth into consideration.

In order therefore to avoid these problems, various measures need to be taken such that the operating power and the shape of the semiconductor element 4 should be limited, the copper plates 2A, 2B should be made thinner and broader so as to decrease its density for mounting on the base member; and others. However, these measures have stood as great obstacles against increase in the function and the density of the semiconductor module.

Incidentally, as a method for relaxing the internal stress caused by difference in the thermal expansion in a structural material wherein ceramic and steel are bonded together, there has been proposed one, in which a layer of relatively soft metal such as aluminum, copper, etc. or a layer of niobium, or a laminated intermediate layer such as niobium/molybdenum, niobium/tungsten, etc. is provided on the bonding surface of both ceramic and steel to a thickness of a few millimeters (vide: a monthly periodical of a title "Kinzoku (Metal)", May, 1986, pp. 45-50). However, as mentioned in the foregoing, the provision of the intermediate layer having a thickness of a few millimeters on the substrate for mounting the semiconductor element would inevitably deteriorate the heat-dissipating property of the substrate with the consequent problem of inability to increase the capacity and the function of the resulting semiconductor module.

SUMMARY OF THE INVENTION

The present invention has been made with a view to solving various points of problem as mentioned in the foregoing, and aims at providing a highly reliable ceramic-metal composite substrate which is capable of being used under any rigorous environment for operation of the semiconductor element (for example, capable of efficiently dissipating heat from the semiconductor element), and yet causes no damage to the ceramic base member and other constituent members.

According to the present invention, in one aspect of it, there is provided a ceramic-metal composite substrate which comprises: a ceramic base member; metal members of a material selected from the group consisting of copper and copper alloys, which is bonded to said ceramic base member; and a constraining member bonded to said metal member, said constraining member being made up of a metal selected from the group consisting of molybdenum, tungsten and alloys thereof, and having a thickness in a range of from 1/20 to ⅓ of the thickness of said metal member.

According to the present invention, in another aspect of it, there is provided a method for producing a ceramic-metal composite substrate, which comprises integrally bonding together a ceramic base member, metal members of a material selected from the group consisting of copper and alloys thereof, and a constraining member to be bonded to said metal member, wherein improvement comprises: bringing said metal member into close contact with said ceramic base member through a thin film layer having a thickness of from 0.1 $\mu$m to 3 $\mu$m and containing therein an active metal; and heating the combination of said ceramic base member, said metal member, and said constraining member in an atmosphere which is difficult to react with said active metal, to a temperature ranging from a melting point of an alloy to be formed of said metal member and said active metal to a temperature below the melting point of said metal member, while applying a pressing force to said combination in the direction of its thickness, thereby realizing the integral bonding.

According to the present invention, in still another aspect of it, there is provided a method for producing a ceramic-metal composite substrate, which comprises integrally bonding together a ceramic base member, metal members of a material selected from the group consisting of copper and alloys thereof, and a constraining member to be bonded to said metal member, wherein improvement comprises: forming a substrate member by bringing first and second copper members into close contact with both surfaces of said ceramic base member through a thin film layer having a thickness of from 0.1 $\mu$m to 3 $\mu$m and containing therein an active metal, and further bringing a third copper member for mounting semiconductor elements into close contact with a non-contacted surface of any one of said first and second copper members through a constraining member; and heating the thus formed substrate in an atmosphere which is difficult to react with said active metal, to a temperature ranging from a melting point of an alloy formed of said first and second copper members and said active metal to a temperature below the melting point of said first and second copper members, while applying a pressing force to the combination of the members in the direction of its thickness, thereby realizing the integral bonding.

The most preferred thin film layer containing therein the active metal to be used for practising the method for producing the composite substrate according to the present invention is a soldering material prepared by blending 2 to 40% by weight of active metal in powder with copper powder, or mixtures containing therein copper powder as the principal component, or powder of copper alloys, of which at least one kind of the copper powder, copper alloy powder, and the active metal powder has a particle size of 5 $\mu$m or above.

The foregoing object, other objects as well as the specific construction and the method of producing the ceramic-metal composite substrate according to the present invention will become more apparent and understandable from the following detailed description thereof, when read in conjunction with the accompanying drawing illustrating the preferred embodiments of the present invention.

BRIEF DESCRIPTION OF THE ACCOMPANYING DRAWING

Figure 8A:
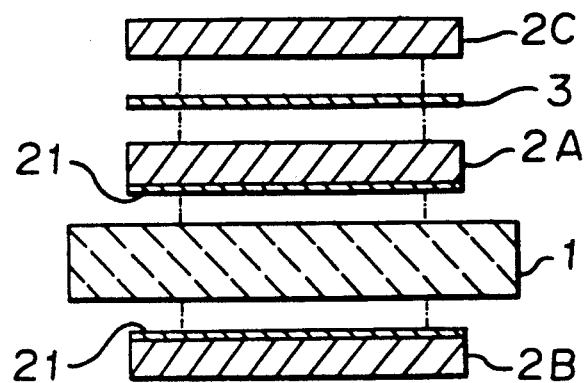
Figure 8B:
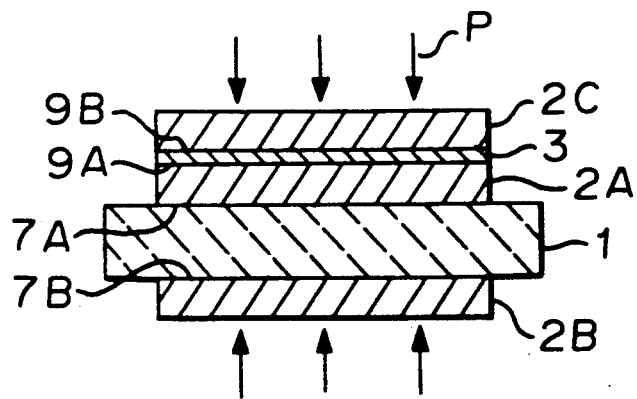

FIGS. 8(a) and 8(b) are respectively schematic diagrams for explaining the method for producing the ceramic-metal composite substrate according to the present invention, wherein FIG. 8(a) is a cross-sectional view of each of the constituent elements before they are bonded into an integral whole, and FIG. 8(b) is a cross-sectional view of each of the constituent elements after they are bonded together.

Figure 9:
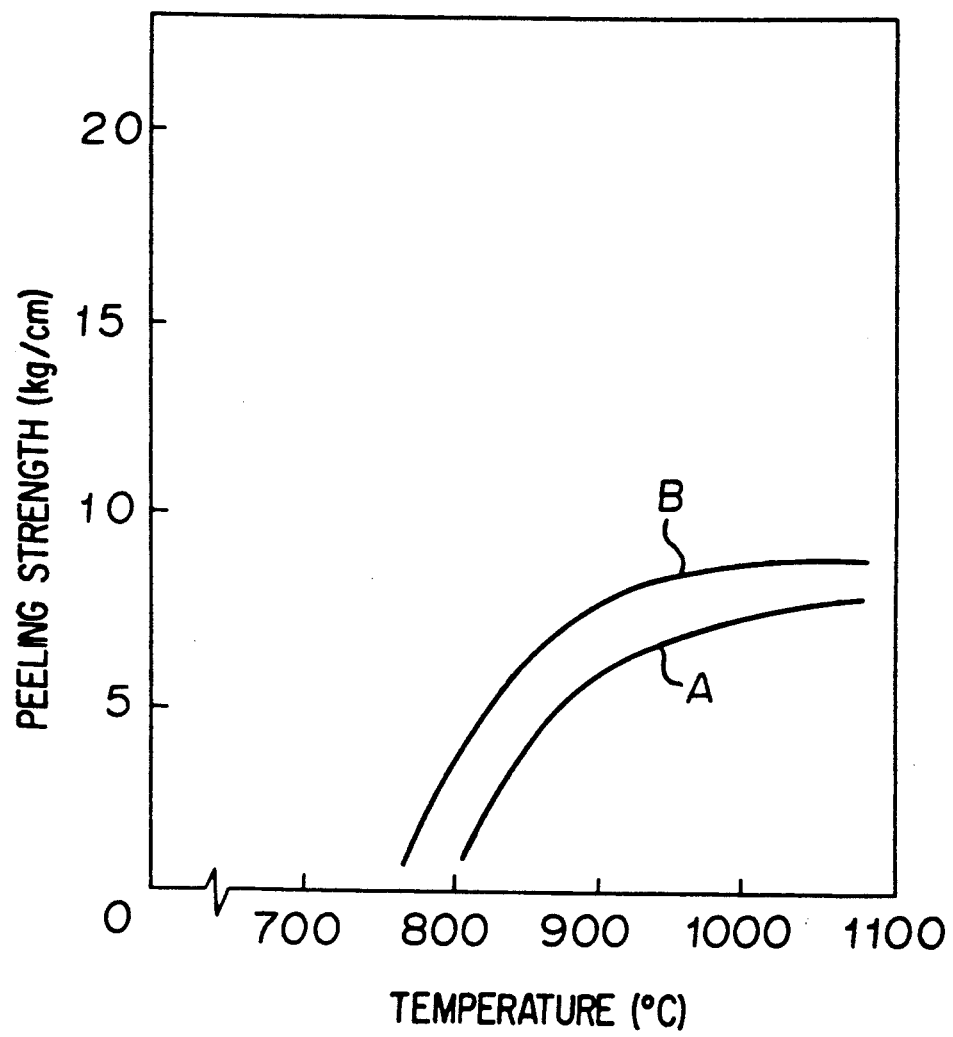
Figure 10:
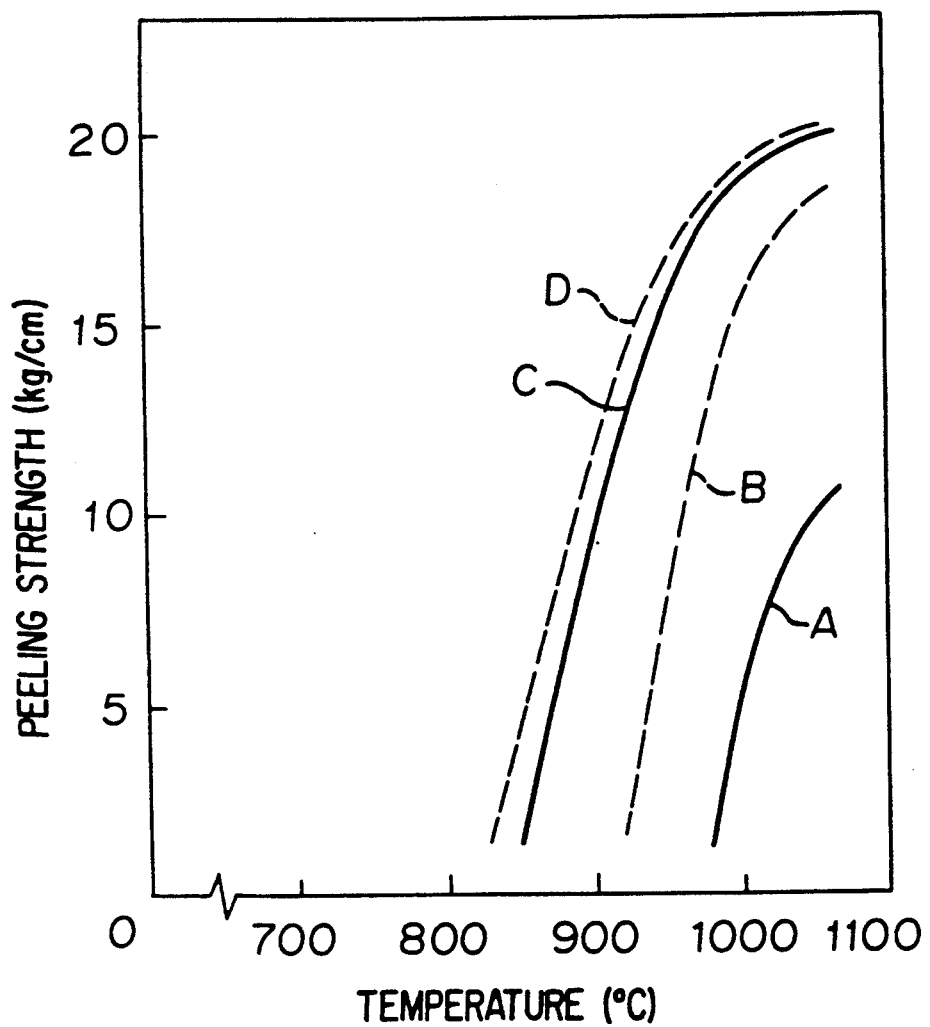
Figure 11:
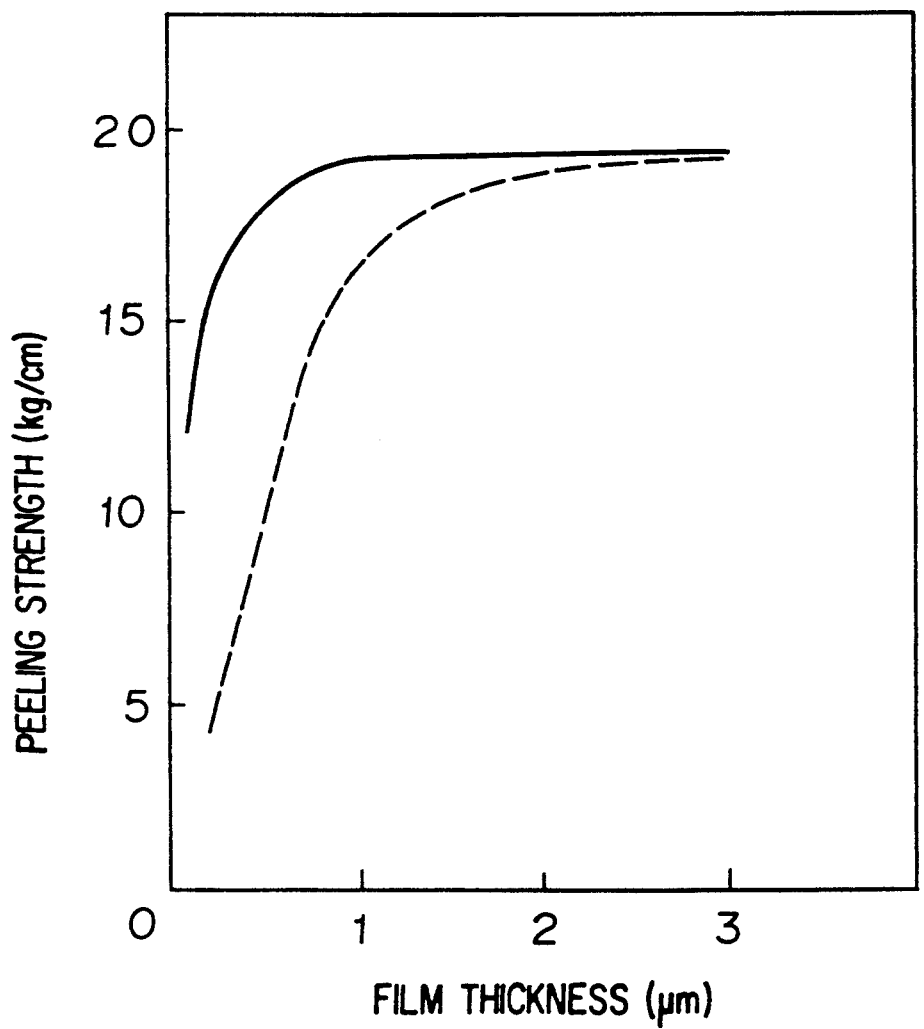
Figure 12A:
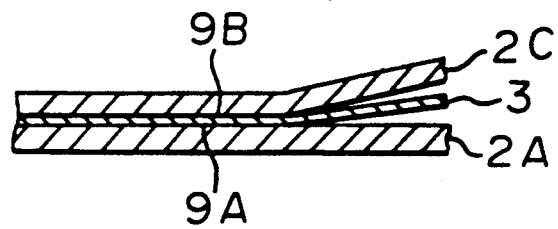
Figure 12B:
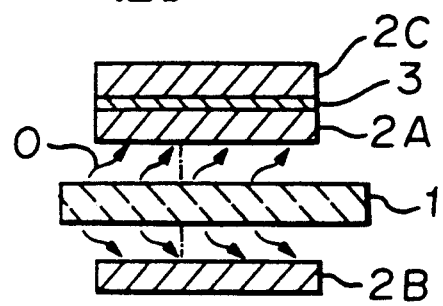
Figure 12C:
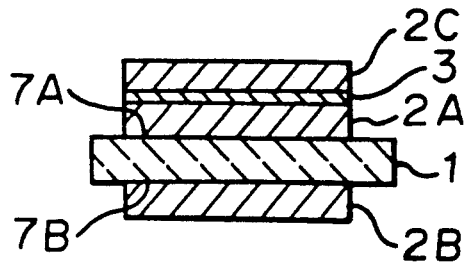
Figure 13A:
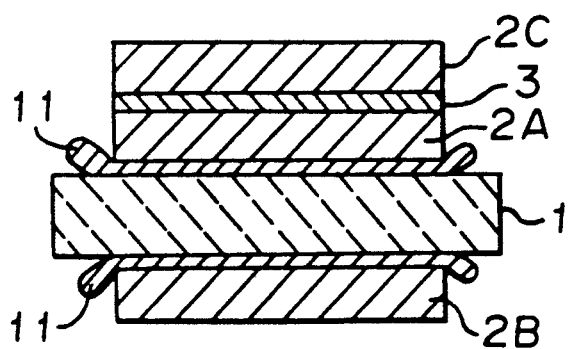
Figure 13B:
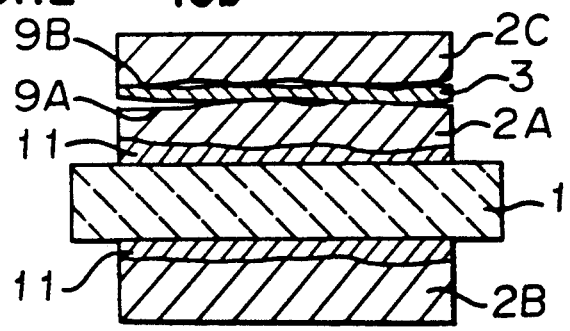
Figure 14A:
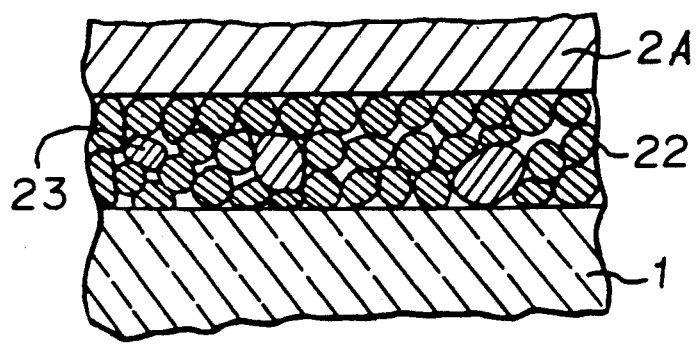
Figure 14B:
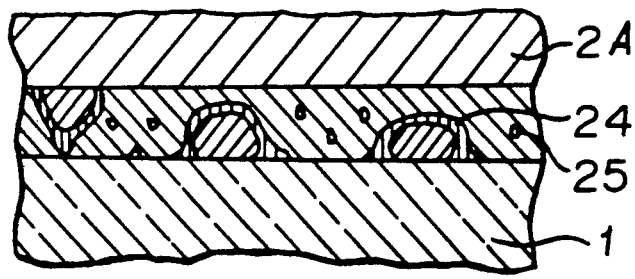
Figure 14C:
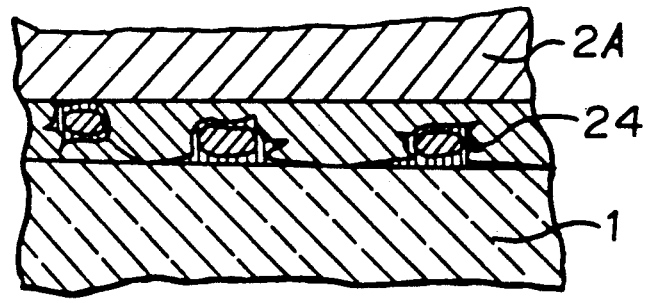

FIG. 9 is a graphical representation showing characteristic curves of the peeling strength-versus-temperature relationship between the copper members and the constraining member according to the present invention;

FIG. 10 is a graphical representation showing characteristic curves of the peeling-strength-versus-temperature relationship between the ceramic base member and the copper members according to the present invention;

FIG. 11 is also a graphical representation showing characteristic curves of the peeling strength-versus-film thickness between the ceramic base member and the copper members according to the present invention;

FIGS. 12(a), 12(b) and 12(c) are respectively explanatory diagrams for producing the ceramic-metal composite substrate according to the present invention by the conventional method, wherein FIG. 12(a) is a cross-sectional view showing a state, in which the constraining member and the copper member are bonded together; FIG. 12(b) is a cross-sectional view, in which the ceramic base member and the copper members are bonded together; and FIG. 12(c) is a cross-sectional view showing a state after completion of the bonding;

FIGS. 13(a) and 13(b) are cross-sectional views respectively showing a state of each of the constituent elements when they are subjected to integral bonding, wherein FIG. 13(a) is a case wherein a pressing force is applied to the entire combination; and FIG. 13(b) is a case wherein no pressing force is applied thereto; and FIGS. 14(a), 14(b) and 14(c) are cross-sectional views respectively showing a state of reaction of the soldering material to be used for the method of production according to the present invention, in which FIG. 14(a) is a cross-sectional view showing an initial state of bonding; FIG. 14(b) is a cross-sectional view showing an intermediate state of bonding; and FIG. 14(c) is a cross-sectional view showing a state after completion of the bonding.

DETAILED DESCRIPTION OF PREFERRED EMBODIMENT

The present invention is concerned with a ceramic-metal composite substrate to be used at the time of manufacturing a semiconductor device, and a method for producing such composite substrate.

In accordance with the present invention, by providing the constraining member having the heat buffer function and a thickness in a range of from 1/20 to ⅓ as thin as that of the metal member of copper or copper alloys, the heat conductivity and the electrical conductivity of the substrate can be secured, and, at the same time, stress to be imparted to the ceramic base member and those elements to be bonded to the base member, such as, for example, semiconductor element, etc., can be reduced, thereby preventing the ceramic base member and the semiconductor element from any possible damage to be caused to them.

In the following, the present invention will be explained in specific details with reference to one preferred embodiment thereof.

Figure 1:
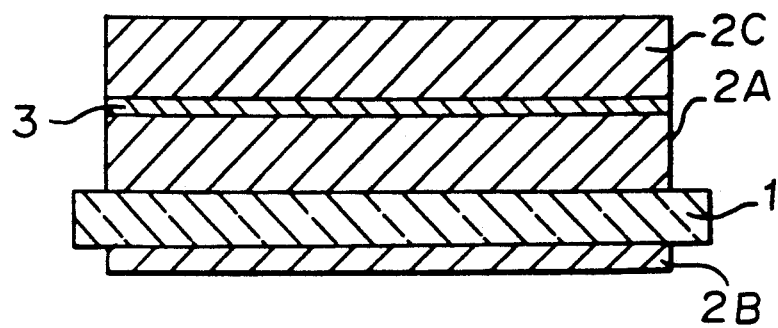
FIG. 1 is a cross-sectional view showing the ceramic-metal composite substrate according to one embodiment of the present invention.

Referring first to FIG. 1 showing a cross-section of the ceramic-metal composite substrate of one embodiment of the present invention, a reference numeral 1 designates the ceramic base member (in this case, it is a planar alumina member); a reference numeral 2A designates a first copper member directly bonded to one surface of the alumina member 1; a reference numeral 2B denotes a second copper member directly bonded to the other surface of the alumina member 1; and a numeral 2C represents a third copper member which has been added to one surface side of the alumina member 1 for the increased capacity of the semiconductor element (not shown in the drawing) which is to be mounted on this third copper member 2C as has been done conventionally. A reference numeral 3 designates a constraining member interposed, in this embodiment, between the first copper member 2A and third copper member 2C. This constraining member is made up of molybdenum in the form of a heat-buffering metal plate having its thickness in a range of from 1/20 to ⅓ as thin as the total thickness of both first and third copper members 2A and 2C.

When the ceramic-metal composite substrate of the above described construction is subjected to a heat-cycle due to changes in a temperature environment and/or operations of the semiconductor device, the copper members 2A, 2B and 2C having large thermal expansion coefficient tend to expand or contract much more than the expansion and contraction of the alumina base member 1 owing to a difference in the thermal expansion coefficient between the copper member and the alumina member, as is the case with the conventional composite substrates. In this embodiment, however, there is adopted a structure such that the thin plate 3 of molybdenum, which is a material having a low thermal expansion coefficient, high mechanical strength, a low heat-resistance, and capable of being integrated with other constituent members, is added to the structure as the constraining member. Molybdenum has its thermal expansion coefficient of about $5 \times 10^{-6}$(/°C.), which is remarkably different from copper having its thermal expansion coefficient of about $17 \times 10^{-6}$(/°C.). On account of such large difference in the thermal expansion coefficient, a large stress occurs at the bonding interface between the molybdenum constraining member and the copper members during the heating and cooling operations. However, since molybdenum has high yield strength (in particular, its thin rolled web has the yield strength of as high as 50 kg/mm² or above), the copper member (having its yield strength of 10 kg/mm²) is rapidly subjected to plastic deformation, while molybdenum sheet functions as the constraining member 3 to prevent a large stress from being imparted to the alumina base member 1. By the way, the stress imparted to the bonding interface between the molybdenum constraining member and the copper member exceeds that of the conventional example, there occurs no cracks at all, because both molybdenum and copper are ductile materials.

In order to rigidly integrate the molybdenum constraining member 3 as the constituent material for the composite substrate, there may be adopted, as one example, a method, in which the molybdenum member 3 and the first and third copper members 2A, 2C are bonded in advance by means of the explosive pressure welding, and so on, after which the thus obtained composite material is bonded to the alumina base member 1 by use of, for example, the DBC method, etc. as disclosed in Japanese Unexamined Patent Publication No. 155580/1985.

The withstanding effect of the ceramic base member 1, etc. against cracks can be seen even with the symmetrical structure of the substrate, in which the ceramic base member 1 is placed at the center of the substrate structure. However, with addition of the constraining member, there arises problems of increase in number of the constituent parts, increase in the material cost, increase in the heat-resistance, and so forth. On the other hand, it is the copper member at the side of the semiconductor element that is required to increase its volume in correspondence to increase in the capacity of the semiconductor element. Thickness of the first and third copper members 2A, 2C at the side of the semiconductor element is required to be 0.3 mm or above in total, an appropriate thickness thereof being 5.0 mm or below. In general, a preferred range thereof is from 0.3 mm to 1 mm. Also, thickness of the constraining member 3 should appropriately be in a range of from 0.015 mm to 1.66 mm; thickness of the ceramic base member 1 should preferably be in a range of from 0.3 mm to 1.0 mm; and thickness of the second copper member 2B should preferably be 0.3 mm or below.

In this embodiment, therefore, only the side of the ceramic base member where the semiconductor element is to be mounted is made the laminated structure of the first copper member 2A, the second copper member 2B, and the molybdenum member 3, while the opposite side is made a structure composed of the second copper member 2B alone. As the result of this, the composite substrate takes a simple and inexpensive structure with good performance. Incidentally, the second copper member 2B is provided for the sake of carrying out the soldering in the later process step, or for the necessity of slightly increasing thickness of the molybdenum member 3, when this second copper member 23 is not provided, so as to take a balance for its absence. Thickness of this second copper member 2B should preferably be 0.3 mm or below the preventing occurrence of cracks in the alumina base member 1, which should be chosen by taking thickness of the molybdenum member 3 and other constituent members into consideration. For instance, when the thickness of the first copper member 2A and the third copper member 2C is selected to be 0.3 mm, and that of the molybdenum member 3 to be 0.1 mm, thickness of the second copper member 2B on the opposite side of the base member 1 should preferably be 0.1 mm. By thus constructing the composite substrate, no warping is brought about on the substrate during its heating and cooling.

As has been mentioned in the foregoing, according to this embodiment, it is possible to obtain the ceramic-metal composite substrate which can be used as the substrate for a power transistor module having high operating reliability and large capacity, which is simple in construction, is capable of dissipating heat generated from the semiconductor element even under a severe environment for its use, and does not cause breakage and damage in the alumina base member 1 and other constituent elements.

Figure 2:
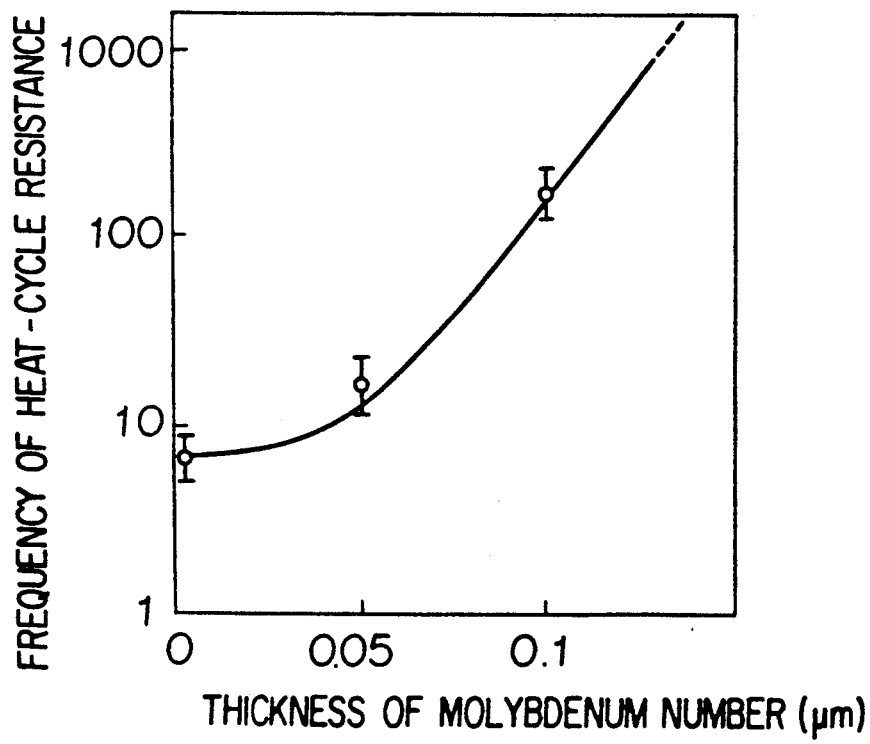
FIG. 2 is a graphical representation showing a characteristic curve of one example of relationship between the heat-cycle resistant property and the thickness of the constraining member in the ceramic-metal composite substrate according to the present invention.

FIG. 2 is a graphical representation showing one example of a relationship between thickness of the molybdenum member 3, which is the heat-buffering metal plate according to the present invention, and frequency of the heat-cycle resistance. In the graph, the abscissa denotes the thickness of the molybdenum member 3, and the ordinate represents the frequency of the heat-cycle resistance (i.e., repeating frequency of heat-cycle until the alumina base member 1 get cracks). This graph indicates the results of the heat-cycle test on the ceramic-metal composite substrate of a symmetrical structure with the following test conditions: (i) total thickness of the copper members being 1.0 mm; (ii) thickness of the alumina member 1 being 0.63 mm; and (iii) the heat-cycle being between −40° C. and 150° C. From FIG. 2, it is seen that the heat-cycle resistant property becomes rapidly improved by making thickness of the molybdenum member 3 to be 0.05 mm or above.

From this test, it was verified that, by absorbing the stress generated between the molybdenum member and the copper member through deformation of the latter, the stress between the copper member and the alumina base member could be reduced, and that, by only adding the molybdenum member 3 which is 1/10 as thin as the thickness of the copper member, the heat-cycle resistant property of the composite substrate could be improved by ten times or more as high as that of the substrate without the molybdenum member. Needless to say, it is not that this effect could be established only when thickness of the copper member is 1.0 mm.

For the thickness of the molybdenum member 3, a range of from 1/20 to ⅓ of the total thickness of the copper members is preferred. By varying the thickness of the molybdenum member within this range, the heat-cycle resistant property, the heat resistance, and the production cost of the substrate can be varied. With the thickness of the molybdenum member 3 being 1/20 or below, no satisfactory improvement in the heat-cycle resistant property can be attained. On the other hand, with the thickness of the molybdenum member 3 being ⅓ or above, its heat-resistance becomes higher with the consequence that the heat dissipation from the semiconductor element becomes insufficient, which is disadvantageous for increasing its functions. In addition, increase in the production cost of the substrate would inevitably decrease the value of its industrial use. Also, with the thickness of the second copper member 2B to be disposed on the opposite side of the base member being 0.3 mm or above, warping takes place in the substrate, which is another problem.

By the way, in the above described embodiment of the present invention, the molybdenum member 3 is interposed between the first copper member 2A and the third copper member 2C, both having the same thickness. It should however be noted that the same effect as mentioned above can be expected, even if the first copper member 2A and the third copper member 2C are of different thickness. The same effect as mentioned above can also be expected, even if the first copper member 2A and the third copper member 2C are made integral, and the molybdenum member 3 is disposed on the surface of a single copper member, or interposed between the copper member and the alumina member.

Figure 3:
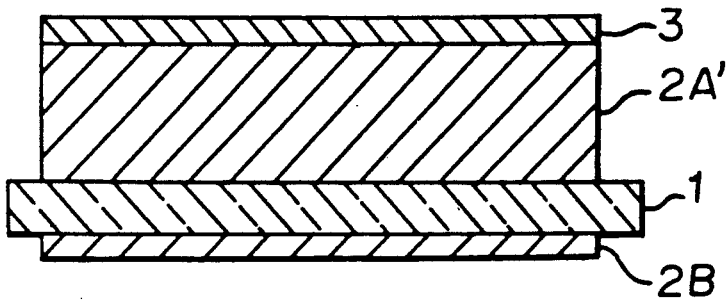
FIG. 3 is a cross-sectional view showing another embodiment of the ceramic-metal composite substrate according to the present invention.

FIG. 3 is a cross-sectional view showing another embodiment of the present invention, in which the molybdenum member 3 is disposed on the surface of a single fourth copper member 2A'. In this embodiment, since the molybdenum member 3 having a small thermal expansion coefficient is disposed on the outer surface of this fourth copper member, a favorable matching can be attained in the thermal expansion between this molybdenum member and the semiconductor element (not shown in the drawing) to be mounted on it. In this embodiment, an appropriate thickness of the fourth copper member 2A' is in a range of from 0.3 mm to 5.0 mm; an appropriate thickness of the molybdenum constraining member 3 is in a range of from 0.015 mm to 1.66 mm; and appropriate thickness of the ceramic base member 1 is in a range of from 0.3 mm to 1.0 mm; and an appropriate thickness of the second copper member 2B is 0.3 mm or below.

Figure 4:
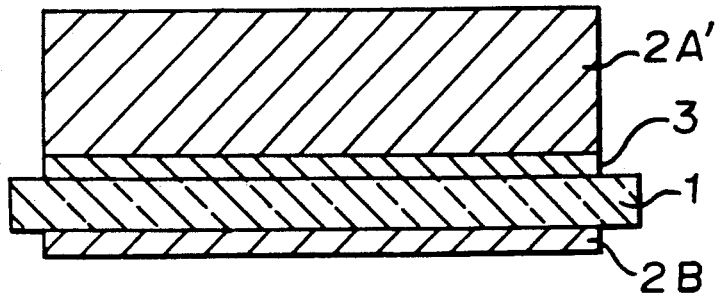
FIG. 4 is a cross-sectional view showing still another embodiment of the ceramic-metal composite substrate according to the present invention.
Figure 5:
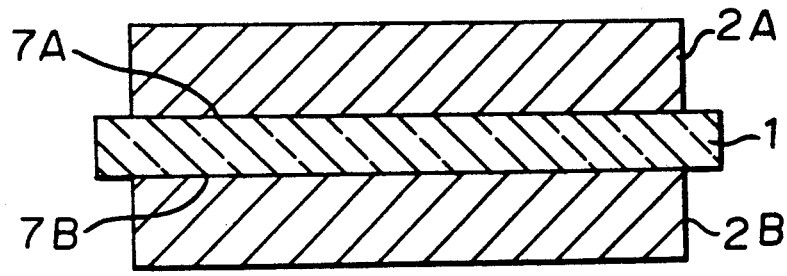
FIG. 5 is a cross-sectional view showing a conventional ceramic-metal composite substrate.

FIG. 4 is a cross-sectional view showing still another embodiment of the present invention, in which the molybdenum member 3 is interposed between the fourth copper member 2A' and the alumina base member 1. In this embodiment, since the molybdenum member 3 is in contact with the alumina base member 1, breakage of the alumina base member 1 can be prevented much more assuredly.

In this connection, it is to be noted that the molybdenum member 3 is not required to be a single layer. Important is that such molybdenum member may be arranged in accordance with the properties of the semiconductor element and the ceramic base member with its total thickness ranging from 1/20 to ½ of the thickness of the copper members.

Further, any of the conventional methods such as the explosive pressure welding, the DBC method, and so forth, as mentioned in the foregoing, can be employed for bonding the ceramic-metal composite substrate. Since, in the substrate according to the present invention, the constituent members are required to be strongly bonded and mutually constrained, a method of bonding by use of a soft and low-melting-point solder such as, for example, eutectic solder is not recommendable.

Furthermore, in the above embodiment of the present invention, explanations have been given as to a case wherein alumina is used as the ceramic base member 1 and molybdenum as the constraining member 3. It should, however, be noted that, even when a brittle insulating substrate material having a small thermal expansion coefficient, such as alumina nitride, silicon carbide, and so on is used in place of alumina, the similar effect can be expected by the aid of the thin constraining member with its thickness ranging from 1/20 to ½ of the thickness of the copper members. In addition, in place of molybdenum, there may also be used tungsten having substantially same degree of the thermal expansion coefficient, the yield strength, and the heat conductivity as those of molybdenum. Moreover, each of the ceramic base member, the copper member, and the constraining member needs not be made up of the entirely same material throughout. In particular, the copper member and the constraining member with heat-buffering function may be made of synthetic substances with the above-mentioned metal element being contained as the principal component, such as, for example, copper alloys, molybdenum alloys, and tungsten alloys, so far as the values of their physical properties such as the thermal expansion coefficient, electrical conductivity, the yield strength, and so on are not varied remarkably.

In the following, detailed explanations will be given as to the production of the ceramic-metal composite substrate according to the present invention.

FIGS. 12(a) to 12(c) are respectively explanatory diagrams of producing the ceramic-metal composite substrate according to the present invention by the conventional method. In the drawing, a reference numeral 1 designates the ceramic base member, and numerals 2A, 2B and 2C refer to the copper members for forming electrical circuits. These copper members 2A, 2B and 2C are made of copper or alloys thereof. The copper members 2A and 2B are disposed on both surfaces of the ceramic base member 1, while the copper member 2C is disposed on the copper member 2A through a constraining member to be explained later. This copper member 2C is added to increase the capacity of the semiconductor element to be mounted on this copper member 2C. A reference numeral 3 designates the constraining member with restrains thermal expansion of the above-mentioned copper members 2A and 2C, the constraining member being made of, for example, molybdenum.

In the next place, explanations will be made as to the method of producing the ceramic-metal composite substrate using these constituent members. Since it is desirable that each of the above-mentioned members be bonded each other without intervention of an intermediate layer such as solder, etc., the constraining member 3 is first held between the copper member 2A and the copper member 2C, as shown in FIG. 12(a), and then these combined members are made integral by any bonding method such as the explosive pressure welding method, and so on. In this way, the bonded surfaces 9A and 9B between the constraining member 3 and the respective copper members 2A, 2C, are made mechanically rigid. Subsequently, the clad member as produced by the above-mentioned steps is shaped by, for example, punching, and other appropriate methods to form a desired electrical circuit pattern. Subsequently, as shown in FIG. 12(b), the ceramic base member 1 is sandwiched between this clad member and the copper member 2B, after which the copper member 2A of the clad member and the copper member 2B are bonded to the ceramic base member 1. The bonding of this ceramic base member 1 and the respective copper members 2A, 2B is carried out by adopting the so-called DBC method and active metal method using oxygen as an intermediary substance, which is disclosed in, for example, Japanese Unexamined Patent Publication No. 155580/1985. By the way, in the drawing, a reference letter "O" designates oxygen for rigidly bonding the ceramic base member 1 with the copper members 2A and 2B. According to the above-mentioned DBC method and active metal method, a molten layer of a few tens of micro-meters ($\mu$m) or so is formed at the bonding surfaces 7A and 7B between the ceramic base member 1 and the respective copper members 2A and 2B. Owing to this molten layer, the ceramic base member 1 and the respective copper members 2A and 2B are bonded in such a manner that they are in a wet condition, hence both copper members 2A and 2B are rigidly bonded to the ceramic base member 1.

Figure 6:
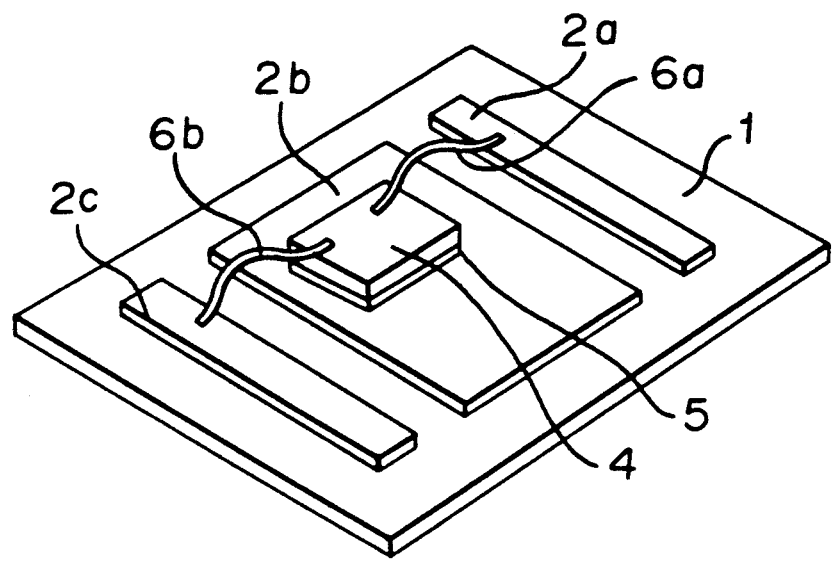
FIG. 6 is a perspective view showing one example a ceramic-metal composite substrate in general.
Figure 7:
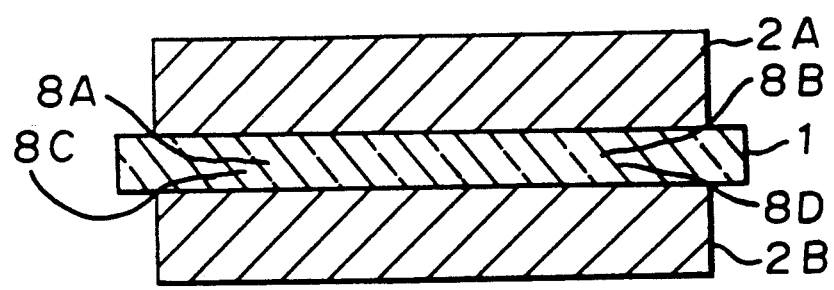
FIG. 7 is a cross-sectional view showing cracks occurred in a conventional ceramic-metal composite substrate.

However, with the method for producing the ceramic-metal composite substrate as mentioned above, two process steps (i.e., a process step for mutually bonding the metal materials, and a process step for bonding metal and ceramic) become necessary with the consequent increase in the production cost. On account of this, while the method is excellent in obtaining the required substrate structure, it is not practical from the aspect of the production cost. In addition, when the copper members 2A and 2B are bonded to the constraining member 3 in the preliminary step, the substrate structure should be made symmetrical, wherein the constraining member 3 is held between the copper members 2A and 2B, each having the same gauge. In other words, when the substrate structure is not symmetrical, undesirable warping takes place due to difference in the thermal expansion coefficient between the copper members 2A, 2B and the constraining member 3 with the result that, in some case, the subsequent process steps becomes unable to be carried out. On account of this, the substrate cannot provide sufficient freedom for its use as the electrical circuit board. For example, it becomes difficult to take preventive measures against breakage of the semiconductor element 4 by decreasing thickness of the copper member 2C, increasing thickness of the copper member 2A, and thus reducing the thermal stress onto the semiconductor element 4 to be mounted on the electrical circuit board as shown in FIG. 6. Further, the surface where the semiconductor element 4 is to be mounted is required to take its shape adapted to form the electrical circuit by machining the composite material obtained from integral bonding of the copper members 2A, 2C and the constraining member 3. However, the conventional machining method using the chemical etching, which is often employed for small-quantity production, cannot afford to do this, because the etching speed differs between the copper members 2A, 2B and the constraining member 3. On account of this, it becomes inevitable that an expensive metal mold be manufactured, and then it is shaped into a desired shape by punching process.

In order to solve such problems, it may be contemplated that each of the constituent members be integrally bonded together. However, mere combination of the above-mentioned production methods into a single process step would bring about a new problem, as follows. First of all, detailed explanations will be given as to a case wherein the metal materials are mutually bonded. Since the copper members 2A, 2C and the constraining member 3 have a large difference in their melting point, it is necessary that they be bonded by the aforementioned explosive pressure welding method, or solid phase bonding method, or soldering method, or other appropriate bonding methods. Since the soldering method in general leaves many unbonded parts in the metal members, when considering the quality of the bonding interface, not only the constituent members cannot be rigidly bonded, but also heat-resistance between the metal members to be brought into close contact each other through the soldering material would increase with the consequent difficulty in obtaining the substrate having high heat conductivity. Accordingly, the copper members 2A, 2C and the constraining member 3 should be bonded by the solid-phase bonding. The principle of the solid-phase bonding is that copper members and constraining member are both bonded by bringing the interfaces of these bonding members closer to the inter-atomic distance, a pressing force is required for their bonding, and, in addition, they should be maintained for a predetermined time under pressure until the interface thereof reacts for dispersion. On the other hand, the BDC method or the active metal method is adopted for bonding the copper members 2A, 2B and the ceramic base member 1. At this instant, a molten layer of several tens of micrometers ($\mu$m) or so is formed to secure a wet condition between the metal member and the ceramic base member, whereby a stable bonding strength can be obtained in a short period of time. By the way, no pressing force is required in this case.

Referring now to FIGS. 13(a) and 13(b), explanations will be given as to the point of problem to arise when the copper members and the ceramic member are internally bonded together by simultaneously effecting the above described two bonding methods. In FIGS. 13(a) and 13(b), the same constituent members as previously explained are designated by the same reference numerals, and the detailed explanations for them will be dispensed with. FIG. 13(a) illustrates the bonding operation, in which pressure is applied for guaranteeing the solid-phase bonding, while FIG. 13(b) shows an example of the bonding operation, in which no pressure is applied to the combination of the constituent members. As shown in FIG. 13(a), when the copper members 2A, 2C and the constraining member 3 are rigidly bonded by the solid-phase bonding, the reactive molten layer 11 is forced out of the bonding surface between the ceramic base member 1 and the respective copper members 2A, 2B with the consequent problem of the electrical circuit being short-circuited. On the other hand, in the bonding operation of FIG. 13(b), in which no pressing force is applied, the bonding surfaces 9A, 9B cannot be bonded with sufficient rigidity, hence desired bonding strength cannot be obtained. Also, the reaction time and the temperature required for the bonding are different between the constituent members, so that, when the copper members 2A, 2B and the ceramic base member 1 are maintained at a high temperature for a long period of time, the reaction between the copper members 2A, 2B and the molten layer proceeds excessively with the consequence that the copper members 2A, 2B are modified and deformed.

In the following, detailed explanations will be given, in reference to FIGS. 8(a), 8(b), 9, 10 and 11, as to a preferred embodiment of the present invention which is free from the above described problems.

FIGS. 8(a) and 8(b) are respectively schematic diagrams for explaining the method for producing the ceramic-metal composite substrate according to the present invention, wherein FIG. 8(a) is a cross-sectional view of each and every constituent member in its state prior to the bonding, and FIG. 8(b) is a cross-sectional view of each and every constituent member in its state after the bonding. FIG. 9 is a graphical representation showing characteristic curves of peeling strength-versus-temperature relationship between the copper members and the constraining member. FIG. 10 is a graphical representation showing characteristic curves of peeling strength-versus-temperature relationship between the ceramic base member and the copper members. FIG. 11 is a graphical representation showing characteristic curves of peeling strength-versus-thickness relationship between the ceramic base member and the copper members according to the present invention. In these figures of drawing, the same or equivalent members as have already been explained in reference to FIG. 12 are designated by the same reference numerals, and any detailed explanations for them are dispensed with. Incidentally, in this embodiment, explanations will be given in reference to a case, wherein alumina is used as the ceramic base member 1. Referring to FIG. 8(a), a reference numeral 21 designates a thin film layer consisting of an active metal. This thin film layer 21 is formed by continuous vacuum evaporation of titanium (Ti) over one surface of each of the copper members 2A, 2B, thickness of which is selected to be from 0.1 $\mu$m to 3 $\mu$m.

In the following, the method for producing the ceramic-metal composite substrate according to the present invention will be explained.

First of all, in order to secure the sufficient bonding strength between the ceramic base member 1 and each of the copper members 2A, 2B active metal of a thickness of from 0.1 $\mu$m to 3 $\mu$m is precoated on the ceramic base member 1 or the bonding surfaces 7A and 7B of the respective copper members 2A and 2B, thereby forming the thin film layer 21. While the precoat may be formed on either the ceramic base member 1 or the copper members 2A, 23, it is desirable that the thin film be formed to the side of the copper members 2A, 2B for the reason that, in consideration of productivity of the composite substrate, such precoat can be formed advantageously be the continuous vapor-deposition on a rolled web of copper for the copper members. In the present embodiment, explanations will be given as to an example of forming the thin film layer 21 on the copper members 2A, 2B. After the thin film layer is formed, the copper members 2A, 2B and 2C and the constraining member 3 are subjected to, for example, the chemical etching for a desired shape. The ceramic base member 1, the copper members 2A, 2B and 2C, and the constraining member 3 formed by the above-mentioned process steps are then layed one by one on a carbon-made jig in a predetermined sequence for bonding, as shown in FIG. 8(a). In this case, the copper members 2A, 2B are placed on both surface sides of the ceramic base member 1 in such a manner that the thin film layer 21 formed on one surface of each copper member may come into contact with the ceramic base member 1. Thereafter, the entire combination of the members as laminated, with the jig, is placed in a vacuum hot-press as the bonding apparatus together. By the way, it should be noted that any other apparatuses than the hot-press may be used as the bonding apparatus, provided that they are capable of providing an atmosphere for the bonding operation, and of effecting pressing and heating. After the members-to be bonded are placed in the bonding apparatus, an atmosphere is formed within the bonding apparatus—an atmosphere such as argon gas, nitrogen gas, a vacuum at about $10^{-4}$ Torr, or others which are difficult to react with the active metal. Subsequently, the pressing and heating are effected on the bonding members, as shown in FIG. 8(b), wherein the direction of pressure application is indicated by arrow mark P. The timing for the pressure application to the bonding members may be done either before its heating or after it has been heated to a certain definite temperature level. In short, it is important that the ceramic base member 1, the copper members 2A, 2B and 2C, and the constraining member 3 be pressed at a temperature for their reaction, to thereby attain the tight bonding among them. The heating speed has no great influence on the bonding of the members, and it can be 50° C./min., for example. After the bonding members have reached a predetermined temperature, a length of time sufficient for their reaction (i.e. bonding) is required. After completion of the bonding, the entire combination is subjected to cooling at a rate, for example, 10° C./min., which does not bring about cracks in the ceramic base member 1, whereby the intended ceramic-metal composite substrate can be obtained.

In the following, detailed explanations will be given as to the phenomenon which takes place at the time of integral bonding of these members.

First of all, the bonding of the copper members 2A, 2B and the constraining member 3 will be explained in reference to FIG. 9, wherein the copper members 2A, 2C are formed of simple copper, and the constraining member is formed of molybdenum. FIG. 9 is a characteristic curves showing a relationship between temperature and peeling strength, in which the abscissa denotes the temperature, and the ordinate represents the peeling strength. In this graphical representation, the characteristic curve A indicates a case where the pressing force is 1 MPa, while the curve B shows a case where it is 20 MPa. Since the copper and molybdenum are bonded in their solid state, a comparatively long time is required for the bonding, which is 20 minutes as is the case with the conventional solid-phase bonding (diffusion bonding). As shown in FIG. 9, a stabilized value for the bonding strength is obtained at a temperature of about 900° C. onward. As to the pressing force, with its being 1 MPa or below, the tight bonding is attained insufficiently, hence no stable bonding strength is realized. On the other hand, with the pressing force being 20 MPa or above, no improvement in the bonding strength can be attained; far from this, the copper members 2A, 2C are deformed to be of less practical value. On the other hand, for the sure bonding of the copper members 2A, 2B and the ceramic base member 1, it is necessary that the reaction speed at the bonding surfaces 7A and 7B be made coincident with the speed of the above-mentioned solid-phase bonding.

FIG. 10 is also the characteristic curves showing the temperature-versus-peeling strength between copper and alumina, in which the abscissa denotes the temperature and the ordinate represents the peeling strength, as is the case with FIG. 9 above, using titanium as the active metal. In the graphical representation, the curves A and B indicate cases where the pressing force is 1 MPa, while the curves C and D represent cases where the pressing force is 20 MPa. Also, in this graphical representation, the solid line curves indicate cases where the thin film layer has a thickness of 1 $\mu$m, while the broken line curves represent cases where the thin film layer has a thickness of 3 $\mu$m. The eutectic temperature of copper and titanium is about 880° C., which is lower than the melting point of both copper and titanium. Therefore, the eutectic composition starts to melt when the temperature is elevated above this eutective temperature. The soldering method, which has conventionally been employed, utilizes a soldering material having a thickness of several tens of micrometers ($\mu$m) or so. This soldering material is a mixture of several kinds of material and has its melting point lower than that of the bonding members, hence when it is heated to a temperature above its melting point, the material becomes abruptly molten. In the present invention, however, the molten layer is formed only as the result of reaction between the thin film layer 21 composed of the active metal and the copper members 2A, 2B. On account of this, the quantity of the molten layer can be varied by forming this thin film layer 21 with its thickness being varied, hence the reaction speed can also be controlled. The graphical representation of FIG. 10 shows that, when the thickness of the thin film layer 21 consisting of titanium is made 1 $\mu$m, a difference in the peeling strength due to difference in the pressing force is greater than in the case where the film thickness is made 3 $\mu$m. That is to say, the graphical representation indicates that, when the film thickness is thin, the molten layer to be formed by the reaction is also thin, hence a pressing force is required for accelerating its close contact and bonding with alumina. Also, with the film layer is made thick, it increases amount of the molten layer which is readily fluidized with the consequence that the pressing force gives less influence on the bonding strength, and its close contact and bonding can be easily realized even under a low temperature. However, when the molten layer is made excessively thick, there arises a problem such that the molten layer is forced outside.

FIG. 11 is also a graphical representation showing the characteristics curves of the peeling strength-versus-film thickness relationship, in which the abscissa denotes the film thickness and the ordinate represents the peeling strength. In the drawing, the solid line curve shows a case where the bonding time is set to be 60 minutes, while the broken line curve indicates a case where it is 20 minutes. By the way, in both cases, the pressing force applied is set to be 10 MPa. This graphical representation clearly indicates that, when the film is thin, more time is taken for the bonding. In more detail, when the film thickness is 0.1 $\mu$m or below, the reaction is slow even if the pressing force is increased to the maximum limit, at which the copper becomes deformed, hence its industrial value is low. In contrast to this, when the film thickness is 3 μm or above, the reaction proceeds quickly, but the molten layer is forced outside of the lamination even at the minimum pressure of 1 MPa normally used for the aforementioned solid phase bonding, on account of which the resulted composite substrate is difficult for its use as the electrical circuit.

From what has been mentioned in the foregoing, the bonding between the copper members 2A, 2B and the ceramic base member 1 can be done simultaneously with bonding of the copper members 2A, 2C and the constraining member 3 under such conditions that thickness of the thin film layer 21 is set in a range of from 0.1 μm to 3 μm; the bonding pressure is set in a range of from 1 to 20 MPa; and the bonding temperature is set in a tange of from the melting point or above of an alloy to be formed by the homogeneous thin film 21 and the copper members 2A, 2B to the melting point or below of the copper members 2A, 2B.

Incidentally, in the above described embodiment of the present invention, the thin film layer 21 to be precoated is made of titanium. It should, however, be noted that this thin film layer is not limited to titanium alone, but any other active metal such as zirconium, etc. may be used, and its composition is also not limited to one kind alone, but any other metals such as silver, etc. can be precoated at the same time. However, since the copper members 2A, 2C and the constraining member 3 attains a stabilized value of the bonding strength at a temperature of about 900° C. or above, it is desirable that the melting point of the alloy to be formed by the copper members 2A, 2B and the thin film layer 21 be close to 900° C. for inhibiting the forcing-out phenomenon, etc. as shown in FIG. 13(a).

Further, in the above described embodiment, the precoat of the active metal has been formed by the vacuum evaporation, although the invention is not limited to this method alone, but any other methods may be adopted for the same effect, provided that the thin film layer 21 is formed with its thickness of from 0.1 μm to 3 μm.

A preferred example of the thin film layer 21 is a soldering material prepared by blending 2 to 30% by weight of active metal powder with copper powder, or mixtures containing copper powder as the principal component, or powder of copper alloys, of which at least one kind of the copper powder, copper alloy powder and active metal powder has a particle size of 5 μm or above. This soldering material may be kneaded with flux, depending on necessity.

FIGS. 14(a), 14(b) and 14(c) illustrate a state of reaction, wherein the soldering material—a kneaded substance formed of, for example, 80% by weight of copper powder having a mean particle diameter of 10 μm and 20% by weight of titanium powder having a mean particle diameter of 20 μm—is heated, in an atmosphere which is difficult to react with the above-mentioned active metal, to a temperature between the melting point of the alloy, when this kneaded substance becomes homogenized, and that of the copper members.

FIG. 14(a) is a cross-sectional view showing the state of reaction of the soldering material at the time of bonding. In the conventionally employed soldering method, since the soldering material is a mixture of several kinds of metal material, it becomes rapidly molten, when heated to a temperature above its melting point. According to this embodiment, however, the molten layer is formed only when copper 22 and titanium 23 are reacted. This phenomenon will be explained hereinbelow. As it will be apparent from the constitutional diagram of copper and titanium, the eutectic temperature of copper and titanium is about 880° C., which is lower than the melting point of copper and titanium. Accordingly, when the bonding temperature is set between the eutectic temperature and the melting point of copper, both copper powder and titanium powder, in their initial state, are mutually contacted in their solid phase condition, as shown in FIG. 14(a). When this state is maintained under pressure, both diffusion and sintering proceed at the same time, as shown in FIG. 14(b). As soon as copper and titanium diffuse and the melting point of the component becomes lower than the bonding temperature, the molten layer 24 is formed, whereby its reaction with ceramic proceeds rapidly. On the other hand, powder metals of the same kind are sintered in their solid phase condition, whereby voids 25 become contracted and gradually disappear. The important point in this embodiment is the reaction speed of these materials, which speed can be controlled by the particle size of the powder material, under the same bonding temperature and mixing ratio. In this case, at least one of copper and titanium should preferably has its particle size of 5 μm or above.

That is to say, since the diffusion length of copper and titanium is approximately 2 μm at a temperature of 900° C. and a reaction time of 10 minutes, when the particle size is below 5 μm, homogenization of the soldering material proceeds rapidly to increase the amount of melting with the consequent problem such that forcing-out of the molten substance takes place due to pressure, as shown in FIG. 13(a). Also, an appropriate content of titanium is from 2 to 40% by weight. In more detail, with the titanium content of 2% by weight or below, its reaction with the ceramic is not sufficient and the required bonding strength cannot be obtained. On the other hand, with the titanium content of 40% by weight, the soldering material as reacted becomes brittle to reduce also the bonding strength. For the efficient use of titanium which is effective in bonding with the ceramic, it had better not to increase negligently the quantity of titanium which remains unreacted in the form of particles. By the way, a preferred particle size of titanium should be about 40 μm or below. Further, for the sake of preventing the voids from remaining inside, which are liable to deteriorate heat-conductivity, other metal powder should also desirably have the particle size of about 40 μm or below.

There has so far been explained the example of forming the soldering material for use as the thin film layer 21 with copper and titanium. It should be noted that the invention is not limited to this example alone, but any other active metals such as zirconium, and so on may be used in place of titanium. Also, those copper alloys containing therein copper as the principal component may be used in place of simple copper. Further, the composition of the soldering material is not limited to these two kinds, but three or more kinds of metals such as copper, silver, titanium, and so forth may be adopted. Note should be taken, however, that, since stailized value of the bonding strength between the copper members 2A, 2C and the constraining member 3 can be obtained at a temperature of about 900° C. or above, the melting point of the alloys, when the thin film layer 21 of the soldering material becomes homogenized, should preferably be close to 900° C. for suppressing excessive reaction.

As has been described in the foregoing, the present invention is so constructed that, in a ceramic-metal composite substrate formed by bonding copper or copper alloys to a ceramic base member, there is bonded to the above-mentioned copper or copper alloy member, a constraining member which is made up of any one of molybdenum, tungsten and alloys thereof, and which has a thickness ranging from 1/20 to ⅓ of the thickness of the copper or copper alloy member. In this way, there can be obtained the ceramic-metal composite substrate which is capable of decreasing thermal stress to be generated in the ceramic base member which is a brittle material, and of preventing the ceramic base member and semiconductor elements to be mounted thereon from being damaged even under a rigorous circumstance for its use.

Also, as has been explained in the foregoing in refenrece to FIGS. 8(a) and 8(b), by the integral bonding of each constituent member for the ceramic-metal composite substrate, it is possible to obtain at a low cost such composite substrate with its bonding parts being free from defects, hence providing high operating reliability.

Although, in the foregoing, the present invention has been described with particular reference to preferred embodiments thereof, the invention is not limited to these embodiments alone, but any changes and modifications may be made by those persons skilled in the art without departing from the spirit and scope of the invention as recited in the appended claims.

What is claimed is:

1. A method for producing a ceramic-metal composite substrate, which comprises integrally bonding together a ceramic base member, a copper based metal member and a constraining member which is to be bonded to said copper based metal member, wherein the improvement comprises:

bringing said copper based metal member into close contact with said ceramic base member through a thin film layer which is formed of an active metal, said copper based metal member and said active metal subsequently forming an alloy when heated, and bringing sand constraining member into contact with said copper based metal member; and heating the combination of said ceramic base member, said copper based metal member and said constraining member in an atmosphere which is essentially inert to said active metal, to a temperature ranging from the melting point of said alloy to a temperature below the melting point of said copper based metal member, while applying a pressing force to said combination in the direction of its thickness, thereby achieving integral bonding of the members.

2. A method for producing a ceramic-metal composite substrate, which comprises integrally bonding together a ceramic base member, copper based metal members and a constraining member to be bonded to one of said copper based metal members, wherein the improvement comprises:

forming a substrate member by bringing first and second copper based metal members into close contact with both surfaces of said ceramic base member each through a thin film layer which is formed of an active metal, said first and second copper based metal members and said active metal layers subsequently forming an alloy when heated, and further bringing a third copper member for mounting semiconductor elements into close contact with a non-contacted surface of any one of said first and second copper members through said constraining member; and heating the thus formed combined layers in an atmosphere which is essentially inert with said active metal, to a temperature ranging from the melting point of said alloy to a temperature below the melting point of said first and second copper members, while applying a pressing force to the combined members in the direction of the thickness of the composite substrate, thereby achieving integral bonding of the members.

3. The method of claim 1, wherein said thin film layer consists of a soldering material which is prepared by blending 2 to 40% by weight of active metal powder with a metal powder selected from the group consisting of copper, mixtures containing copper powder as the principal component and copper alloys, and wherein at least one of said copper powder, copper alloy powder and active metal powder has a particle size of 5 $\mu$m or above.

4. The method of claim 3, wherein said active metal is at least one element selected from the group consisting of titanium, zirconium and silver.

5. The method of claim 2, wherein each of said thin film layers consists of a soldering material which is prepared by blending 2 to 40% by weight of active metal powder with a metal powder selected from the group consisting of copper, mixtures containing copper powder as the principal component and copper alloys, and wherein at least one of said copper powder, copper alloy powder and active metal powder has a particle size of 5 $\mu$m or above.

6. The method of claim 5, wherein said active metal is at least one element selected from the group consisting of titanium, zirconium and silver.

7. The method of claim 1, wherein said active metal is at least one element selected from the group consisting of titanium, zirconium and silver.

8. The method of claim 2, wherein said active metal is at least one element selected from the group consisting of titanium, zirconium and silver.

9. The method of claim 1, wherein said bonding pressure is in the range of from 1 to 20 MPa.

10. The method of claim 2, wherein said bonding pressure is in the range of from 1 to 20 MPa.

11. The method of claim 1, wherein said thin film layer has a thickness of from 0.1 $\mu$m to 3 $\mu$m.

12. The method of claim 2, wherein said thin film layer has a thickness of from 0.1 $\mu$m to 3 $\mu$m.

* * * * *